(12) United States Patent
Cooper

(10) Patent No.: US 7,041,204 B1
(45) Date of Patent: May 9, 2006

(54) PHYSICAL VAPOR DEPOSITION COMPONENTS AND METHODS OF FORMATION

(75) Inventor: Matthew S. Cooper, Portersville, PA (US)

(73) Assignee: Honeywell International Inc., Morristown, NJ (US)

( * ) Notice: Subject to any disclaimer, the term of this patent is extended or adjusted under 35 U.S.C. 154(b) by 597 days.

(21) Appl. No.: 09/699,897

(22) Filed: Oct. 27, 2000

(51) Int. Cl.
*C23C 14/34* (2006.01)
*C22F 1/10* (2006.01)

(52) U.S. Cl. .......................... 204/298.12; 204/298.13; 148/300; 148/312; 148/120; 148/121; 148/676; 148/677

(58) Field of Classification Search ............ 204/298.12, 204/298.13; 148/100, 120, 121, 559, 675, 148/676, 677, 300, 312
See application file for complete search history.

(56) References Cited

U.S. PATENT DOCUMENTS

| | | | |
|---|---|---|---|
| 4,481,470 A | 11/1984 | Wallace | 324/228 |
| 4,784,739 A | 11/1988 | Kodokura et al. | 204/192.2 |
| 4,832,810 A | 5/1989 | Nakamura | 204/192.15 |
| 5,087,297 A | 2/1992 | Pouliquen | 148/691 |
| 5,282,947 A | 2/1994 | Brugge et al. | 204/298.2 |
| 5,334,267 A | 8/1994 | Taniguchi et al. | 148/425 |
| 5,456,815 A | 10/1995 | Fukuyo et al. | 204/298.13 |
| 5,590,389 A | 12/1996 | Dunlop et al. | 419/67 |
| 5,658,442 A | 8/1997 | Van Gogh | 204/298.12 |
| 5,741,377 A | 4/1998 | Goyal et al. | 148/512 |
| 5,798,005 A | 8/1998 | Murata et al. | 148/421 |
| 6,071,389 A | 6/2000 | Zhang | 204/298.12 |
| 6,086,725 A * | 6/2000 | Abburi et al. | 204/192.1 |
| 6,123,783 A | 9/2000 | Bartholomeusz et al. | 148/312 |
| 6,258,217 B1 | 7/2001 | Richards et al. | 204/192.12 |
| 6,278,271 B1 | 8/2001 | Schott | 324/251 |
| 6,299,740 B1 | 10/2001 | Hieronymi et al. | 204/192.12 |
| 6,391,172 B1 * | 5/2002 | Cole et al. | 204/298.13 |
| 6,454,911 B1 | 9/2002 | Xu et al. | |
| 2001/0001438 A1 | 5/2001 | Cole et al. | 204/298.13 |

FOREIGN PATENT DOCUMENTS

| | | |
|---|---|---|
| EP | 0882813 | 12/1998 |
| EP | 1041170 A2 | 10/2000 |
| GB | 2324612 | 10/1998 |
| JP | 59108970 | 6/1984 |
| JP | 8253859 | 1/1996 |
| WO | WO9824945 | 6/1998 |
| WO | WO 9848269 | 10/1998 |
| WO | WO9902750 | 1/1999 |
| WO | WO9910548 | 3/1999 |
| WO | WO 99/10548 * | 3/1999 |
| WO | WO9961670 | 12/1999 |
| WO | WO 00/40770 | 4/2000 |
| WO | PCT/US01/16410 | 11/2001 |
| WO | WO 02/086183 A1 | 10/2002 |
| WO | WO02/086183 A1 | 10/2002 |

OTHER PUBLICATIONS

Derwent Abstract GB 2353294A.

* cited by examiner

*Primary Examiner*—Rodney G. McDonald
(74) *Attorney, Agent, or Firm*—Wells St. John P.S.

(57) ABSTRACT

A PVD component forming method includes inducing a sufficient amount of stress in the component to increase magnetic pass through flux exhibited by the component compared to pass through flux exhibited prior to inducing the stress. The method may further include orienting a majority crystallographic structure of the component at (200) prior to inducing the stress, wherein the induced stress alone is not sufficient to substantially alter surface grain appearance. Orienting structure may include first cold working a component blank to at least about an 80% reduction in cross-sectional area. The cold worked component blank can be heat treated at least at about a minimum recrystallization temperature of the component blank. Inducing stress may include second cold work to a reduction in cross-sectional area between about 5% to about 15% of the heat treated component. At least one of the first and second cold working can be unidirectional.

17 Claims, 1 Drawing Sheet

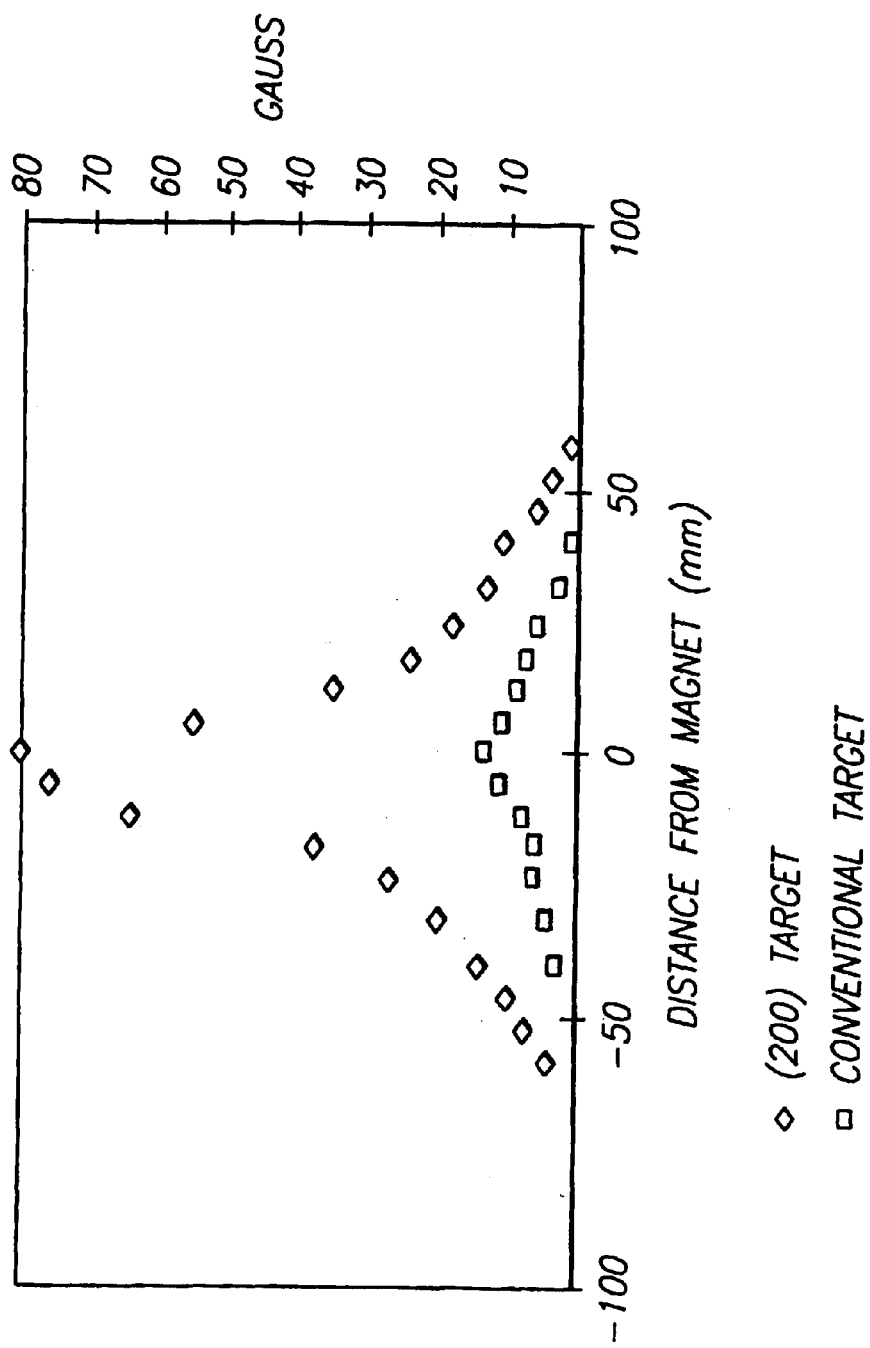

US 7,041,204 B1

PHYSICAL VAPOR DEPOSITION COMPONENTS AND METHODS OF FORMATION

TECHNICAL FIELD

The invention relates to physical vapor deposition (PVD) components, for example, sputter targets, and methods of forming PVD components and sputter targets, including magnetic flux enhancement methods for PVD components.

BACKGROUND OF THE INVENTION

Sputtering is a common physical vapor deposition (PVD) process used often in semiconductor processing as well as other processing and fabrication. The properties of a PVD component, such as a target, impose varying effects on properties exhibited by a deposited film. Grain size is known to influence deposited film uniformity and is preferably less than about 100 microns. Further, as grain size increases, a phenomenon known as secondary re-crystallization can be observed wherein isolated domains of extremely large grains (greater than about 200 microns) appear in a component material. Secondary re-crystallization can also be detrimental to deposited film uniformity. Other properties of a component material may effect deposited film uniformity and limit target life as well.

Accordingly, a need exists to reduce grain size of sputtering targets and identify material properties beneficial to forming deposited films and prolonging target life.

SUMMARY OF THE INVENTION

In one aspect of the invention, a PVD component forming method includes inducing a sufficient amount of stress in the component to increase magnetic pass through flux exhibited by the component compared to pass through flux exhibited prior to inducing the stress. The method may further include orienting a majority crystallographic structure of the component at (200) prior to inducing the stress, wherein the induced stress alone is not sufficient to substantially alter surface grain appearance.

In another aspect of the invention, a physical vapor deposition (PVD) component forming method includes first cold working a component blank to at least about an 80% reduction in cross-sectional area. The cold worked component blank may be heat treated at least at about a minimum recrystallization temperature of the component blank and second cold worked to a reduction in cross-sectional area between about 5% to about 15% of the heat treated component. By way of example, at least one of the first and second cold working can comprise cold rolling. The component blank can consist essentially of nickel. At least one of the first and second cold working can be unidirectional and the heat treating may be performed with a fluidized bed furnace. Also, the heat treating can include substantially uniformly heating the cold worked component blank at least to the minimum recrystallization temperature in less than about 60 minutes. The cold worked component blank can be maintained at least at the minimum recrystallization temperature for less than about 60 minutes.

In another aspect of the invention, a sputter component forming method can include unidirectionally first cold working a component blank to at least about an 80% reduction in cross-sectional area and heat treating the cold worked component blank at least at about a minimum recrystallization temperature of the component blank. A sufficient amount of stress may be induced in the heat treated component to increase magnetic pass through flux exhibited by the heat treated component compared to pass through flux exhibited prior to inducing the stress.

In a further aspect of the invention, a sputter target forming method can include unidirectionally first cold rolling a target blank consisting essentially of nickel to at least about an 85% reduction in cross-sectional area. Heat treatment of the cold rolled target blank can occur at a temperature between about 427° C. (800° F.) to about 482° C. (900° F.) for less than about 60 minutes. Second cold rolling of the heat treated target blank can occur to a reduction in cross-sectional area of about 10% of the heat treated component. The second cold rolled target blank may exhibit at least about 70% of a surface area at least within selected boundaries of a surface of the second cold rolled target blank having a (200) texture.

In another aspect of the invention, a magnetic flux enhancement method for a sputter component includes combining unidirectional cold working of a sputter component with heat treatment at about a minimum recrystallization temperature and orienting predominant crystallographic structure preferentially at (200). The method may include additional unidirectional cold working in a same direction as initially cold worked.

In a still further aspect of the invention, a PVD component includes nickel exhibiting a (200) texture over at least about 50% of a surface area at least within selected boundaries and having a sufficient amount of residual stress to exhibit higher magnetic pass through flux compared to pass through flux exhibited absent such stress. Additional aspects of the invention include PVD components or targets produced by the methods described above.

BRIEF DESCRIPTION OF THE DRAWINGS

Preferred embodiments of the invention are described below with reference to the following accompanying drawing.

The FIGURE shows a chart comparing magnetic pass through flux of a sputter target according to the present invention compared to a conventional target.

DETAILED DESCRIPTION OF THE PREFERRED EMBODIMENTS

The need to reduce grain size of sputter targets and identify crystallographic orientations and magnetic properties beneficial to forming sputter films has prompted investigation of physical vapor deposition (PVD) component forming methods. Observation indicates that crystallographic orientation and magnetic softness or hardness may also influence sputter film uniformity. Magnetically soft materials may attenuate the magnetic flux from a sputter apparatus cathode, focusing the magnetic field to a small portion of a sputter target. The focused field can result in a sharp, deep sputter track that accelerates burn-through and limits target life.

In the context of the present application, "magnetically soft" materials exhibit a tendency to lose magnetization more quickly in comparison to a "magnetically hard" material. Magnetically soft materials often can be magnetized and demagnetized readily with little or no permanent magnetization (remanence). Generally, magnetically hard materials are more difficult to magnetize, but retain remanent magnetization. Also, a "sputter component" used in the context of the present application denotes sputter targets as well as other components in a sputter chamber that may undergo sputtering. The processing parameters described herein for PVD component forming methods and magnetic flux enhancement methods pertain particularly to sputter targets containing nickel, but may also apply to PVD components of other compositions.

In one aspect of the invention, a PVD component forming method includes first cold working a component blank to at least about an 80% reduction in cross-sectional area. Next, the cold worked component blank may be heat treated at least at about a minimum recrystallization temperature of the component blank. The heat treated component blank can be second cold worked to a reduction in cross-sectional area between about 5% to about 15% of the heat treated component.

The high level of first cold work may assist in reducing secondary recrystallization effects that result in anomalous rapid grain growth in isolated domains. Typically, the objective of the cold working is to minimize the artifacts of pre-existing structure, such as grain size and texture, from the starting component blank. The artifacts can be merely cosmetic (swirls, ghosts, etc.) but can also be non-uniform structures in portions of the first cold worked component. It is desirable to maximize uniformity by cold working and observation indicates that about 80–90% cold work can be adequate. Preferably, cross-sectional area is reduced by at least about 85% to obtain a preferred level of uniformity and minimization of artifacts.

Cold working preferably comprises cold rolling, however, extrusion, drawing, forging, and other cold working methods known to those skilled in the art may also be suitable. Also, preferably cold rolling or other cold working can be unidirectional to produce a high level of (200) crystallographic orientation. One disadvantage of unidirectional cold rolling is generation of scrap material. Conventionally, "round to round" rolling allows a higher utilization level for starting material compared to unidirectional rolling, that generates more scrap because of limitations on rolling directions.

However, unidirectional rolling provides advantageous crystallographic orientation. For example, the first cold worked component blank may exhibit an orientation ratio of at least 50% (200) or, preferably, at least about 70% (200). In measuring orientation ratio, at least 50% or at least 70% of a surface area at least within selected boundaries of a surface of the first cold worked component blank may exhibit a (200) texture. Cross-rolling or "round-to-round rolling" can be detrimental, even in small amounts, to obtaining a majority (200) texture. However, simple unidirectional cold rolling of a nickel sputter target blank has been observed to produce a majority (200) texture. Preferably, the component blank consists essentially of nickel. However, other materials, particularly those having a face-centered cubic crystalline structure, may be suitable to achieve the advantages of the various aspects of the invention. The first cold working, as well as the second cold working, may occur at a temperature of about 20° C. (68° F.) or some other suitable temperature known to those skilled in the art to be considered cold working.

The heat treating may comprise substantially uniformly heating the cold worked component blank at least to the minimum recrystallization temperature in less than about 60 minutes. Such a heating step, or annealing, is desirable since lengthy, high temperature annealing is known to lead to secondary recrystallization and produce the detrimental effects of PVD component microstructure described above. The heated, cold worked component blank may be maintained at least at the minimum recrystallization temperature for less than about 60 minutes.

The initial heating and maintaining the temperature may be performed in a fluidized bed furnace. Fluidized bed furnaces can impart quick and uniform heat transfer to the cold worked PVD component blank. A variety of fluidized bed furnaces known to those skilled in the art may be suitable for accomplishing the heat treating described herein. A variety of heat transfer media may be used in the fluidized bed furnace, for example, alumina has proven suitable. Other fast-transfer methods, such as quartz-bulb (infrared) or electric induction furnace, may be used in the place of a fluidized bed furnace to heat the PVD component blank quickly and uniformly.

After maintaining the cold worked component blank at the described temperature, the component blank may be air cooled to 20° C. (68° F.) or another desired temperature. Alternatively, the component blank may be quenched to a temperature less than the minimum recrystallization temperature. A suitable heat treating temperature may be between about 371° C. (700° F.) to about 649° C. 1200° F.) or, preferably, between about 427° C (800° F.) to about 482° C. (900° F.). The range of 800° F. to 900° F. is particularly suitable for a sputter target blank consisting essentially of nickel.

After heat treating, the PVD component blank preferably exhibits an average grain size of less than about 50 microns. Average grain size can be measured by a variety of techniques, for example, one suitable technique is ASTM Test Method E112. When measuring average grain size or texture, as in a (200) texture, such measurement may occur within selected boundaries of at least a portion of a surface area of the PVD component blank. As an example, the measured area defined by the selected boundaries may include at least about a statistically representative area. The statistically representative area may be calculated by any current or future method known to those skilled in the art. Also, it may be desirable to evaluate whether an outer surface of a specimen accurately reflects grain size or texture of the overall microstructure by removing an outer surface to expose inner portions of a specimen. An unrepresentative measurement might skew data such that a more narrow or wide distribution of grain size or texture is calculated than would result from evaluating the entirety of measurable surfaces of a specimen. Evaluating all of the surfaces of a specimen that are conducive to the measurements indicated (i.e., measurable) may be possible. Even so, evaluating representative areas is more efficient and thus desirable. Rules of thumb or other methods may be known in the art for selecting a representative area, in addition to Test Method E112 referenced above.

Second cold working the heat treated component blank may be used to reduce cross-sectional area to between about 5% to about 15% of the heat treated component. The small amount of cold working after heat treatment has been observed to create a small amount of residual stress in the target and yield a relatively large increase in the magnetic flux that may pass through a PVD component blank as measured perpendicular to the blank face. The amount of stress is small enough to be virtually undetectable visually and mechanically and has not been observed to degrade sputtered films formed from such a component. It appears that the induced stress alone is not sufficient to substantially alter surface grain appearance.

Preferably, the second cold working reduction in cross-sectional area is about 10%. Also, preferably the second cold working comprises cold rolling and can comprise a different cold working process than used for the first cold working. The second cold working is also preferably unidirectional as described for the first cold working, but only one might be unidirectional. Preferably, the first and second cold working are both unidirectional and each are in the same direction. Working in the same direction further minimizes any impact of the second cold working on desirable grain size and texture obtained from first cold working and heat treating.

Accordingly, the method of the present aspect of the invention can produce a PVD component that exhibits a (200) texture over at least about 50% of a surface area. The component may also exhibit an average grain size of less than about 50 microns. The grains may have an adequate amount of residual stress to enhance magnetic flux. In this manner, a PVD component will exhibit a small grain size and also exhibit a crystallographic orientation properly stressed to allow a higher pass through flux (PTF) than absent the stress, prolonging target life. FIG. 1 is a chart showing an overall increase in PTF for a (200) nickel sputter target produced according to the present aspect of the invention in comparison to a conventional (220) nickel sputter target without induced stress.

One possible explanation for the PITF improvement of the invention in the case of nickel targets relates to the magnetostriction properties of nickel. Speaking simplistically, a magnetic field causes the face centered cubic crystalline structure of nickel to constrict. When nickel grains of a sputter target are oriented with a (200) texture, a magnetic field perpendicular to the target face produces constriction in a direction also perpendicular to the target face. A portion of the magnetic field is thus involved in the constriction, affecting PTF. Inducing stress in the target to produce constriction before exposure to a magnetic field is observed to increase PTF. It is presumed that the induced constriction reduces further constriction by the magnetic field, involving less of the magnetic field and allowing more flux.

Accordingly, in one aspect of the invention, a PVD component forming method includes inducing a sufficient amount of stress in the component to increase magnetic pass through flux exhibited by the component compared to pass through flux exhibited prior to inducing the stress. A variety of stress inducing methods other than cold working may be suitable to accomplish the method. The method may further include orienting a majority crystallographic structure of the component at (200) prior to inducing the stress, wherein the induced stress alone is not sufficient to substantially alter surface grain appearance. In this manner, beneficial characteristics of grain size and texture are largely unaffected, but PTF can be improved. It is conceivable that textures other than (200) and materials other than nickel may also be suitable for practicing the methods described herein with analogous advantages.

In another aspect of the invention, a sputter component forming method may include unidirectionally first cold working a component blank to at least about an 80% reduction in cross-sectional area. The cold worked component blank may be heat treated at least at about a minimum recrystallization temperature of the component blank. A sufficient amount of stress may be induced in the heat treated component to increase magnetic pass through flux exhibited by the heat treated component compared to pass through flux exhibited prior to inducing the stress. Such a method can achieve at least some of the advantages described herein as desirable for sputter components. Inducing stress may include unidirectionally second cold working the heat treated component to a reduction in cross-sectional area between about 5% to about 15% of the heat treated component. The second cold working used in the described method may further improve the desirable properties of the sputter component.

In a further aspect of the invention, a sputter target forming method can include unidirectionally first cold rolling a target blank consisting essentially of nickel to at least about an 85% reduction in cross-sectional area. The cold rolled target blank can be heat treated at a temperature between about 427° C. (800° F.) to about 482° C. (900° F.) for less than about 60 minutes. The heat treated target blank can be second cold rolled to a reduction in cross-sectional area of about 10% of the heat treated component. At least about 70% of a surface area at least within selected boundaries of a surface of the second cold rolled target blank may exhibit a (200) texture.

In another aspect of the invention, a magnetic flux enhancement method for a sputter component may include combining unidirectional cold working of a sputter component with heat treatment at least at about a minimum recrystallization temperature. The method may further include orienting predominant crystallographic structure preferentially at (200) followed by additional unidirectional cold working in a same direction as initially cold worked.

In keeping with the aspects of the invention described above regarding methods of forming PVD components, a PVD component in another aspect of the invention may consist essentially of nickel exhibiting a (200) texture over at least about 50% of a surface area at least within selected boundaries. As described, the selected boundaries may define a representative test area. The component may have a sufficient amount of residual stress to exhibit higher magnetic pass through flux compared to pass through flux exhibited absent such stress.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A PVD component consisting essentially of a material having a face-entered cubic crystalline structure, the component being produced by the method comprising inducing a sufficient amount of residual stress in the component to increase magnetic pass through flux exhibited by the component during PVD compared to pass through flux exhibited without inducing the stress.

2. The component of claim 1 comprising a majority crystallographic structure of (200).

3. The component of claim 1 wherein the induced stress alone is not sufficient to substantially alter surface grain appearance.

4. The component of claim 1 wherein the component consists essentially of nickel.

5. The component of claim 1 wherein the material exhibits an average grain size of less than about 50 microns.

6. A sputter component produced by the method comprising:
   unidirectionally first cold working a component blank to
      at least about an 80% reduction in cross-sectional area, the component blank consisting essentially of a material having a face-centered cubic crystalline structure;

heat treating the cold worked component blank at least at about a minimum recrystallization temperature of the component blank; and inducing a sufficient amount of stress in the heat treated component blank to increase magnetic pass through flux exhibited by the heat treated component blank compared to pass through flux exhibited prior to inducing the stress.

7. The component of claim 6 wherein the heat treated component blank comprises a majority crystallographic structure of (200).

8. The component of claim 6 wherein the induced stress alone is not sufficient to substantially alter surface grain appearance.

9. The component of claim 6 wherein the component blank consists essentially of nickel.

10. The component of claim 6 wherein the stress-induced component blank exhibits an average grain size of less than about 50 microns.

11. A sputter target produced by the method comprising:

unidirectionally first cold rolling a target blank consisting essentially of nickel to at least about an 85% reduction in cross-sectional area;

heat treating the first cold rolled target blank at a temperature between about 427° C. (800° F.) to about 482° C. (900° F.) for less than about 60 minutes; and second cold rolling the heat treated target blank to a reduction in cross-sectional area of about 10% of the heat treated target blank, at least about 70% of a surface area at least within selected boundaries of a surface of the second cold rolled target blank exhibiting a (200) texture.

12. The target of claim 11 wherein the second cold rolling comprises unidirectionally rolling in the same direction as the first cold rolling.

13. A PVD component consisting essentially of nickel exhibiting a (200) texture over at least about 50% of a surface area at least within selected boundaries and having a sufficient amount of residual stress to exhibit higher magnetic pass through flux compared to pass through flux exhibited absent such stress.

14. The component of claim 13 wherein the selected boundaries define a representative test area.

15. The component of claim 13 wherein the nickel exhibits an average grain size of less than about 50 microns.

16. A PVD component consisting essentially of material having a face-centered cubic crystalline structure, the material exhibiting a (200) texture over at least about 70% of a representative surface area, having a sufficient amount of residual stress in the component to increase magnetic pass through flux exhibited by the component during PVD compared to pass through flux exhibited without inducing the residual stress, but such induced residual stress alone not being sufficient to substantially alter surface grain appearance.

17. A PVD component produced by the method comprising:

unidirectionally first cold working a component blank consisting essentially of a material having a face-centered cubic crystalline structure to at least about an 80% reduction in cross-sectional area;

heat treating the first cold worked blank at a temperature between about 371° C. (700° F.) to about 649° C. (1200° F.) for less than about 60 minutes; and unidirectionally second cold working the heat treated blank to a reduction in cros-sectional area of between about 5% to about 15% of the heat treated blank thereby inducing a sufficient amount of residual stress in the blank to increase magnetic pass through flux exhibited by the component during PVD compared to pass through flux exhibited without inducing the residual stress, at least about 70% of a surface area of the second cold worked blank exhibiting a (200) texture and the induced residual stress alone not being sufficient to substantially alter surface grain appearance.

* * * * *